(12) United States Patent
Sinsheimer et al.

(10) Patent No.: US 7,358,754 B2
(45) Date of Patent: *Apr. 15, 2008

(54) METHODS AND APPARATUS FOR CREATING A HIGH SPEED CONNECTION BETWEEN A DEVICE UNDER TEST AND AUTOMATIC TEST EQUIPMENT

(75) Inventors: Roger Sinsheimer, Petaluma, CA (US); D. Evan Williams, Petaluma, CA (US)

(73) Assignee: Xandex, Inc., Petaluma, CA (US)

( * ) Notice: Subject to any disclaimer, the term of this patent is extended or adjusted under 35 U.S.C. 154(b) by 13 days.

This patent is subject to a terminal disclaimer.

(21) Appl. No.: 11/479,354

(22) Filed: Jun. 30, 2006

(65) Prior Publication Data

US 2006/0244471 A1 Nov. 2, 2006

Related U.S. Application Data

(63) Continuation of application No. 11/189,953, filed on Jul. 25, 2005, now Pat. No. 7,078,890, which is a continuation of application No. 10/965,245, filed on Oct. 13, 2004, now Pat. No. 6,963,211, which is a continuation of application No. 10/725,966, filed on Dec. 1, 2003, now Pat. No. 6,833,696.

(60) Provisional application No. 60/452,196, filed on Mar. 4, 2003.

(51) Int. Cl.
*G01R 31/02* (2006.01)
(52) U.S. Cl. ............ 324/758; 324/754; 324/537
(58) Field of Classification Search ............ None
See application file for complete search history.

(56) References Cited

U.S. PATENT DOCUMENTS 4,589,815 A  5/1986  Smith
4,613,193 A  9/1986  Beers
4,911,643 A  3/1990  Perry et al.
4,969,824 A  11/1990  Casciotti
5,015,193 A  5/1991  Krumme et al.

(Continued)

FOREIGN PATENT DOCUMENTS

JP          04109645 A  *  4/1992

(Continued)

OTHER PUBLICATIONS

International Search report, PCT/US2004/005858, issued Jun. 12, 2004.

(Continued)

*Primary Examiner*—Paresh Patel
(74) *Attorney, Agent, or Firm*—Beyer Weaver LLP.

(57) ABSTRACT

Methods and apparatus are described for connecting a first plurality of signal lines to a second plurality of signal lines. A first assembly includes a plurality of first contact arrays. Each of the contacts in each of the first contact arrays is in electrical contact with a corresponding one of the first plurality of signal lines. Each of the first contact arrays has a first mechanical alignment feature associated therewith. A second assembly includes a plurality of contact assemblies. Each of the contact assemblies is suspended within the second assembly such that each contact assembly is operable to move independently in at least four degrees of freedom relative to the second assembly. Each contact assembly has a second contact array associated therewith. Each of the contacts in each of the second contact arrays is in electrical contact with a corresponding one of the second plurality of signal lines. Each of the contact assemblies has a second mechanical alignment feature associated therewith. The second contact array of each contact assembly is operable to align with a corresponding one of the first contact arrays through interaction of the first and second mechanical alignment features and movement of the corresponding contact assembly in at least some of the degrees of freedom.

15 Claims, 20 Drawing Sheets

U.S. PATENT DOCUMENTS

| | | |
|---|---|---|
| 5,068,601 A | 11/1991 | Parmenter |
| 5,092,781 A | 3/1992 | Casciotti |
| 5,552,701 A | 9/1996 | Veteran et al. |
| 5,804,983 A | 9/1998 | Nakajima et al. |
| 5,821,764 A | 10/1998 | Slocum et al. |
| 5,828,225 A | 10/1998 | Obikane et al. |
| 5,923,180 A | 7/1999 | Botka et al. |
| 5,986,447 A | 11/1999 | Hanners et al. |
| 6,004,142 A | 12/1999 | Wark |
| 6,036,519 A | 3/2000 | Lopata et al. |
| 6,040,691 A | 3/2000 | Hanners et al. |
| 6,064,195 A * | 5/2000 | Clayton et al. .......... 324/158.1 |
| 6,398,570 B1 | 6/2002 | Yoshida et al. |
| 6,784,678 B2 * | 8/2004 | Pietzschmann ............. 324/758 |

FOREIGN PATENT DOCUMENTS

JP        04109646 A  *  4/1992

OTHER PUBLICATIONS

International Written Opinion, PCT/US2004/005858, issued Jun. 12, 2004.

Office Action received in U.S. Appl. No. 11/548,382, dated Aug. 8, 2007.

* cited by examiner

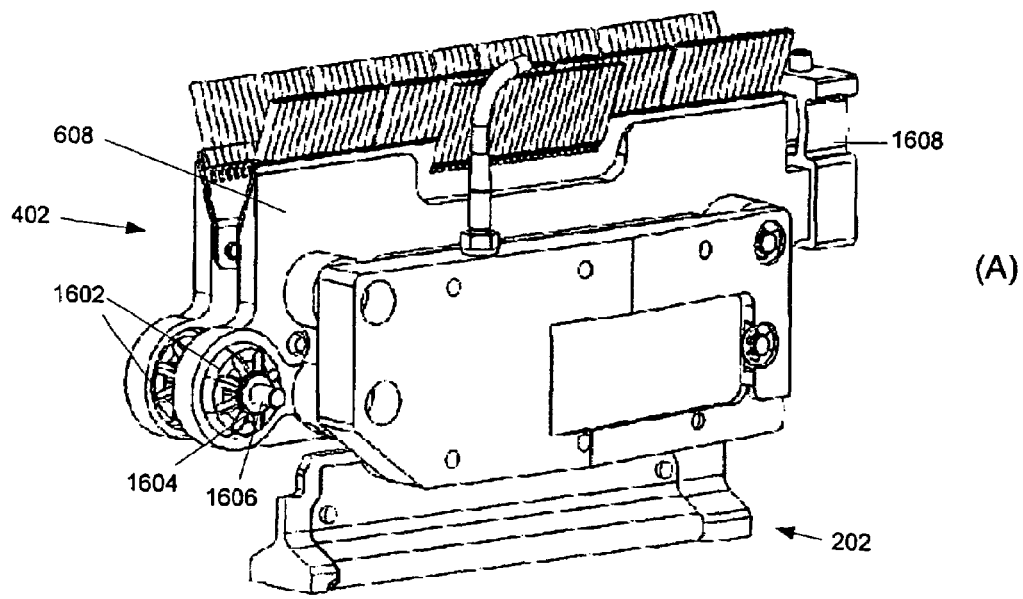
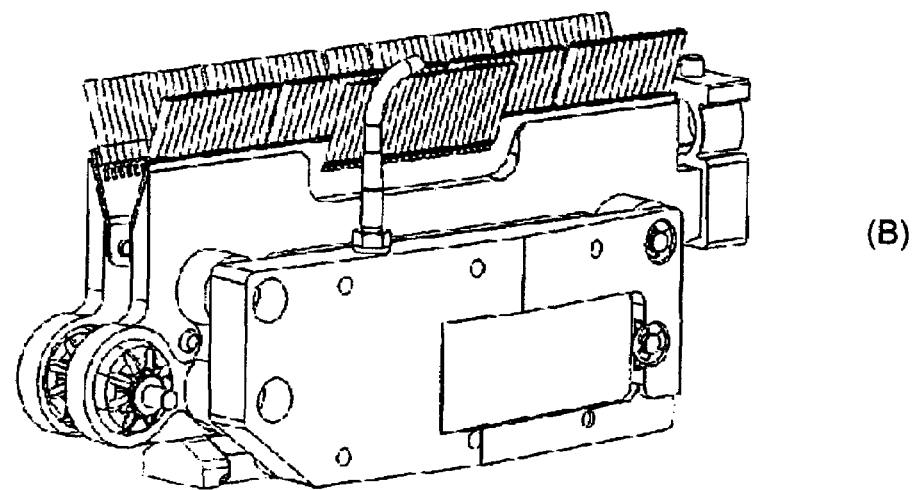
Fig. 16
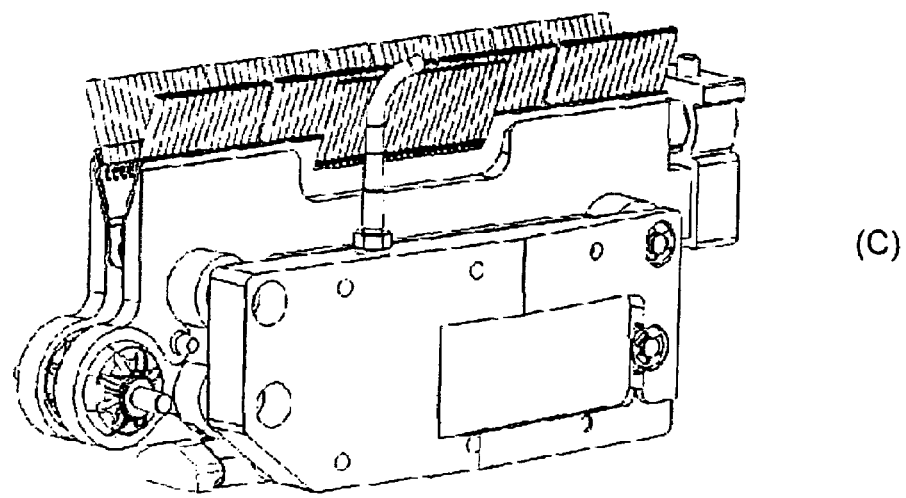

METHODS AND APPARATUS FOR CREATING A HIGH SPEED CONNECTION BETWEEN A DEVICE UNDER TEST AND AUTOMATIC TEST EQUIPMENT

RELATED APPLICATION DATA

The present application is a continuation application of and claims priority from U.S. patent application Ser. No. 11/189,953, filed Jul. 25, 2005, now U.S. Pat. No. 7,078,890, which is a continuation application of and claims priority from U.S. patent application Ser. No. 10/965,245, filed Oct. 13, 2004, now U.S. Pat. No. 6,963,211, which is a continuation application of and claims priority from U.S. patent application Ser. No. 10/725,966, filed Dec. 1, 2003, now U.S. Pat. No. 6,833,696, which claims priority from U.S. Provisional Patent Application No. 60/452,196, filed Mar. 4, 2003, the entire disclosure of each of which is incorporated herein by reference for all purposes.

BACKGROUND OF THE INVENTION

The present invention relates to techniques for reliably creating a large number of high-speed electrical connections between two circuits. More specifically, the present invention provides a variety of techniques for establishing such connections with a high cycle life while requiring a very low externally-created force to facilitate the connect-disconnect cycle.

With higher and higher parallelism required in high-speed electrical systems (e.g., semiconductor test systems), the sum total of the force necessary to establish connections between circuits is becoming difficult to overcome by mechanical means. In addition, the very nature of conventional interconnect schemes which are characterized by high contact forces and metal-on-metal abrasion results in relatively low cycle life due to the resulting damage to the noble metal plating on the electrical contacts.

It is therefore desirable to provide techniques for establishing high-speed connections which do not suffer from the aforementioned disadvantages.

SUMMARY OF THE INVENTION

According to various embodiments of the present invention, methods and apparatus are provided for connecting a first plurality of signal lines to a second plurality of signal lines. A first assembly includes a plurality of first contact arrays. Each of the contacts in each of the first contact arrays is in electrical contact with a corresponding one of the first plurality of signal lines. Each of the first contact arrays has a first mechanical alignment feature associated therewith. A second assembly includes a plurality of contact assemblies. Each of the contact assemblies is suspended within the second assembly such that each contact assembly is operable to move independently in at least four degrees of freedom relative to the second assembly. Each contact assembly has a second contact array associated therewith. Each of the contacts in each of the second contact arrays is in electrical contact with a corresponding one of the second plurality of signal lines. Each of the contact assemblies has a second mechanical alignment feature associated therewith. The second contact array of each contact assembly is operable to align with a corresponding one of the first contact arrays through interaction of the first and second mechanical alignment features and movement of the corresponding contact assembly in at least some of the degrees of freedom.

According to a specific embodiment, a interface assembly is provided for connecting a first plurality of signal lines to a second plurality of signal lines. The first plurality of signal lines are associated with a probe card assembly which includes a plurality of first contact arrays. Each of the contacts in each of the first contact arrays is in electrical contact with a corresponding one of the first plurality of signal lines. Each of the first contact arrays has a first mechanical alignment feature associated therewith. The interface assembly includes a plurality of contact assemblies. Each of the contact assemblies is suspended within the interface assembly such that each contact assembly is operable to move independently in at least four degrees of freedom relative to the interface assembly. Each contact assembly has a second contact array associated therewith. Each of the contacts in each of the second contact arrays is in electrical contact with a corresponding one of the second plurality of signal lines. Each of the contact assemblies has a second mechanical alignment feature associated therewith. The interface assembly is configured such that the second contact array of each contact assembly is operable to align with a corresponding one of the first contact arrays through interaction of the first and second mechanical alignment features and movement of the corresponding contact assembly in at least some of the degrees of freedom.

A further understanding of the nature and advantages of the present invention may be realized by reference to the remaining portions of the specification and the drawings.

BRIEF DESCRIPTION OF THE DRAWINGS

FIGS. 16A-16C show a perspective view of a clamping assembly and a spine assembly at various stages of the docking process.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known features may not have been described in detail to avoid unnecessarily obscuring the invention.

Figure 1:
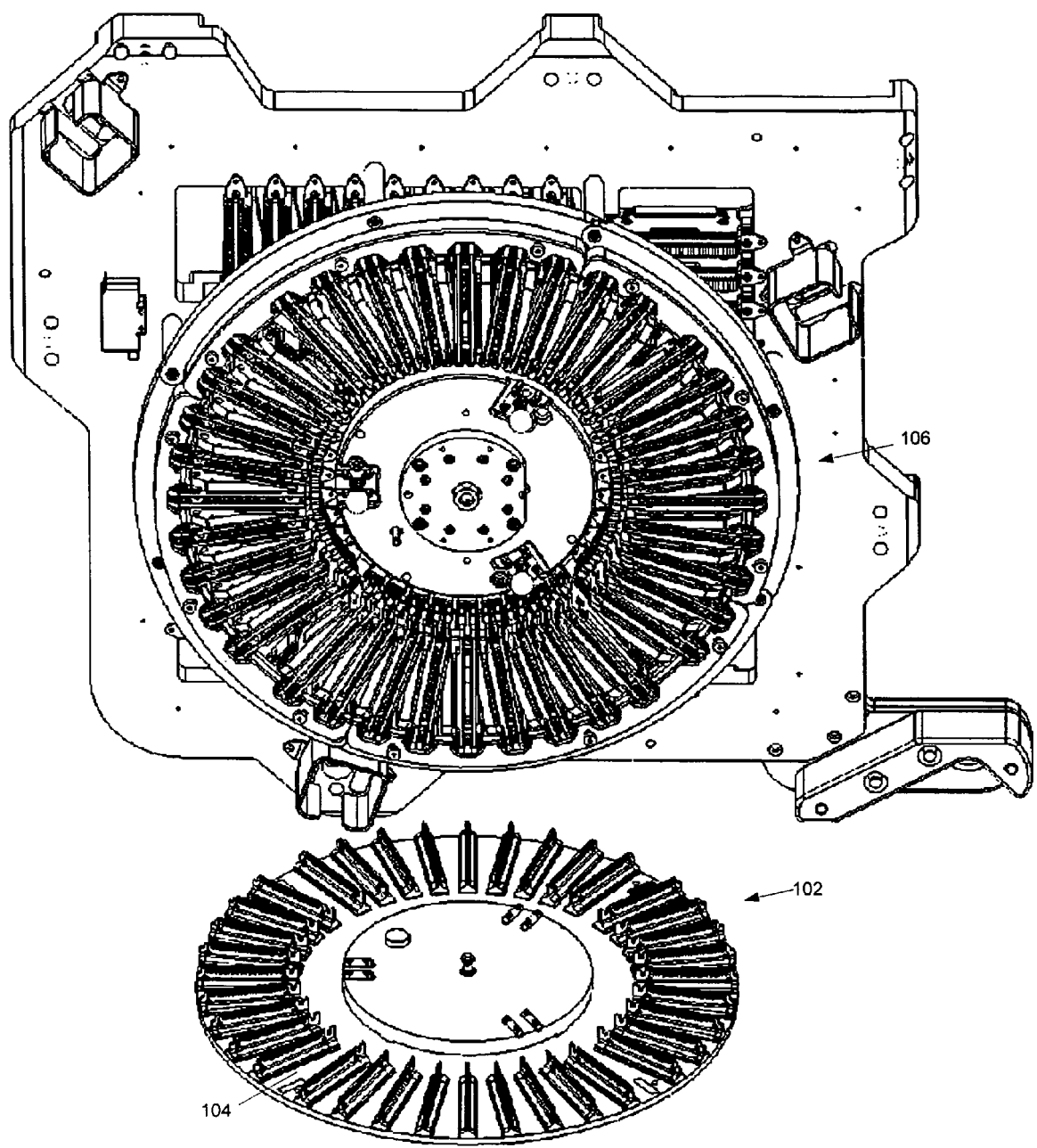
FIG. 1 shows a device under test (DUT) printed circuit board assembly and a corresponding tower assembly designed according to a specific embodiment of the invention.

According to a specific embodiment of the invention shown in FIG. 1, a system 100 for establishing a large number of high-speed connections between automated test equipment (not shown) and at least one device under test (DUT) (not shown). A DUT assembly 102 is provided on the underside of which are a large number of electrical contacts (not shown) to one or more DUTs. Such electrical contacts might be, for example, probe needles if DUT assembly 102 is probe card for use in wafer sort, or sockets if DUT board 102 is a contactor board for use in package test. The primary function of DUT assembly 102 is to translate electrical signals out of the plane of board 104 so that they are accessible to the connection mechanism, i.e., interface tower assembly 106.

Figure 2:
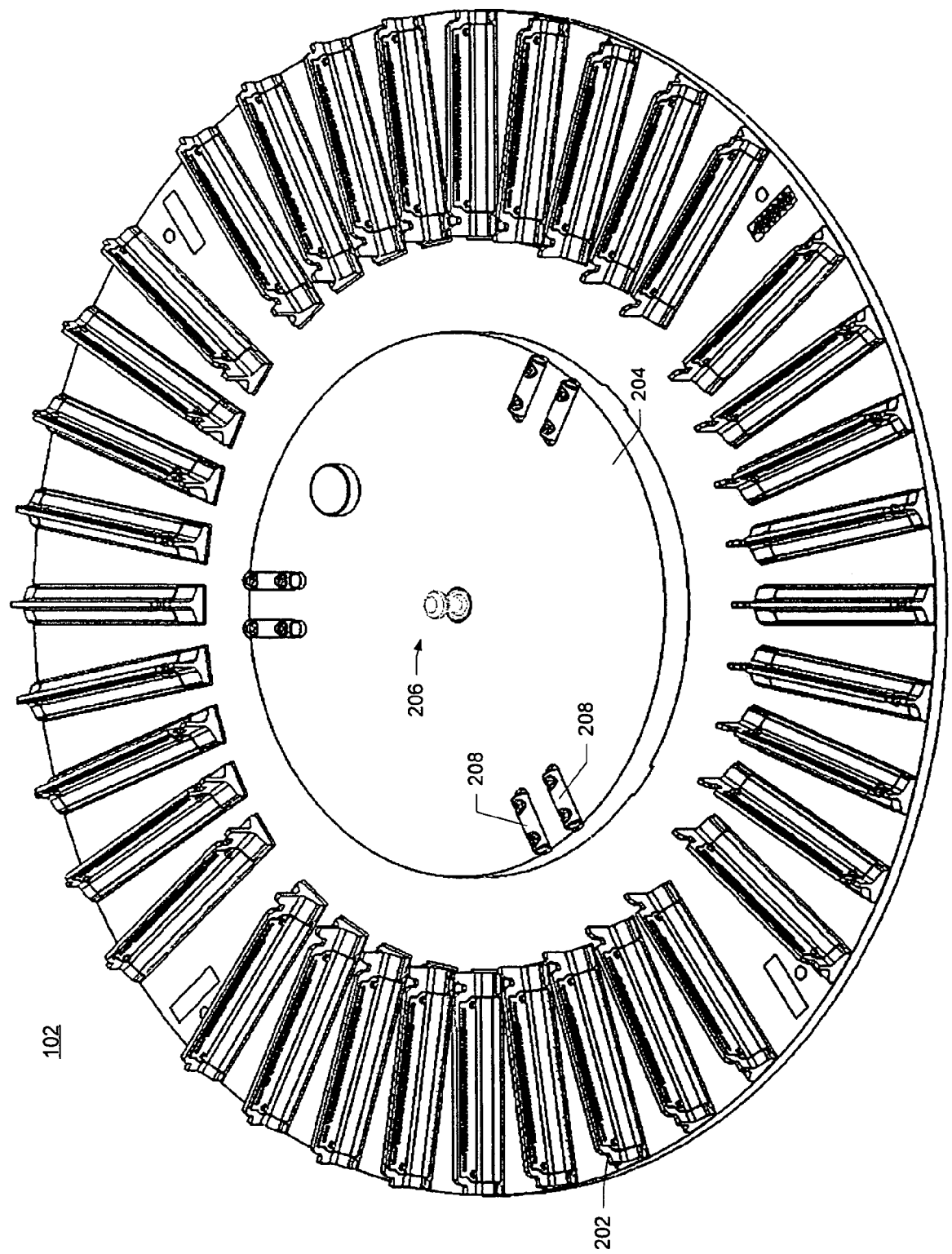
FIG. 2 is a closer view of the DUT assembly of FIG. 1.
Figure 3:
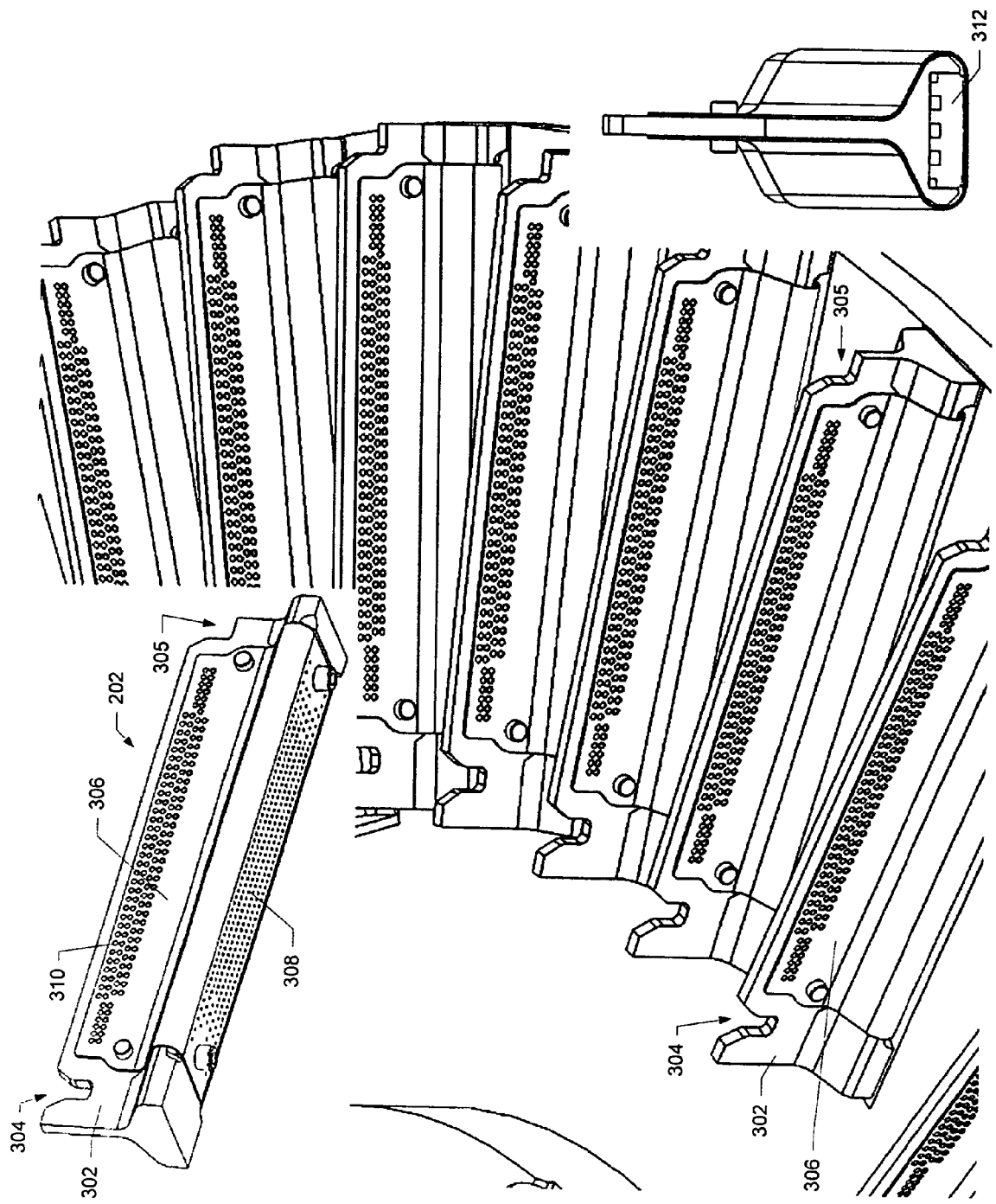
FIG. 3 is still a closer view of the DUT assembly of FIG. 1 showing detailed features of the plurality of spine assemblies disposed thereon.

Referring now to FIG. 2, DUT assembly 102 has a plurality of "spine" structures 202 disposed radially on board 104 which facilitate the signal translation. A specific implementation of spines 202 is shown in FIG. 3. Each spine 202 comprises a rigid support assembly 302 which includes fine alignment slots 304 and 305. A flex circuit 306 fastened to and supported by assembly 302 includes signal traces (not shown) which transmit signals between contacts 308 at the bottom of assembly 302 to contacts 310 on either side of assembly 302. Contacts 308 mate with corresponding contacts (not shown) on the surface of board 104 when spine 202 is secured in place.

According to a specific embodiment, support assembly 302 may include flexible material 312 disposed as shown in assembly 302 which provide contact backup for contacts 308. According to some embodiments, similar contact backup may be provided for contacts 310. While embodiments are contemplated in which such contact backup is provided by the rigid material of which assembly 302 is constructed, the flexible nature of material 312 ensures that the electrical connections made with contacts 308 will have sufficient integrity despite any possible minor variations in contact height. That is, to make the connection reliable across the entire connection array, there may either be a compressible member in the system, or the flatness tolerance of the components may be controlled to a very tight tolerance.

Figure 19:
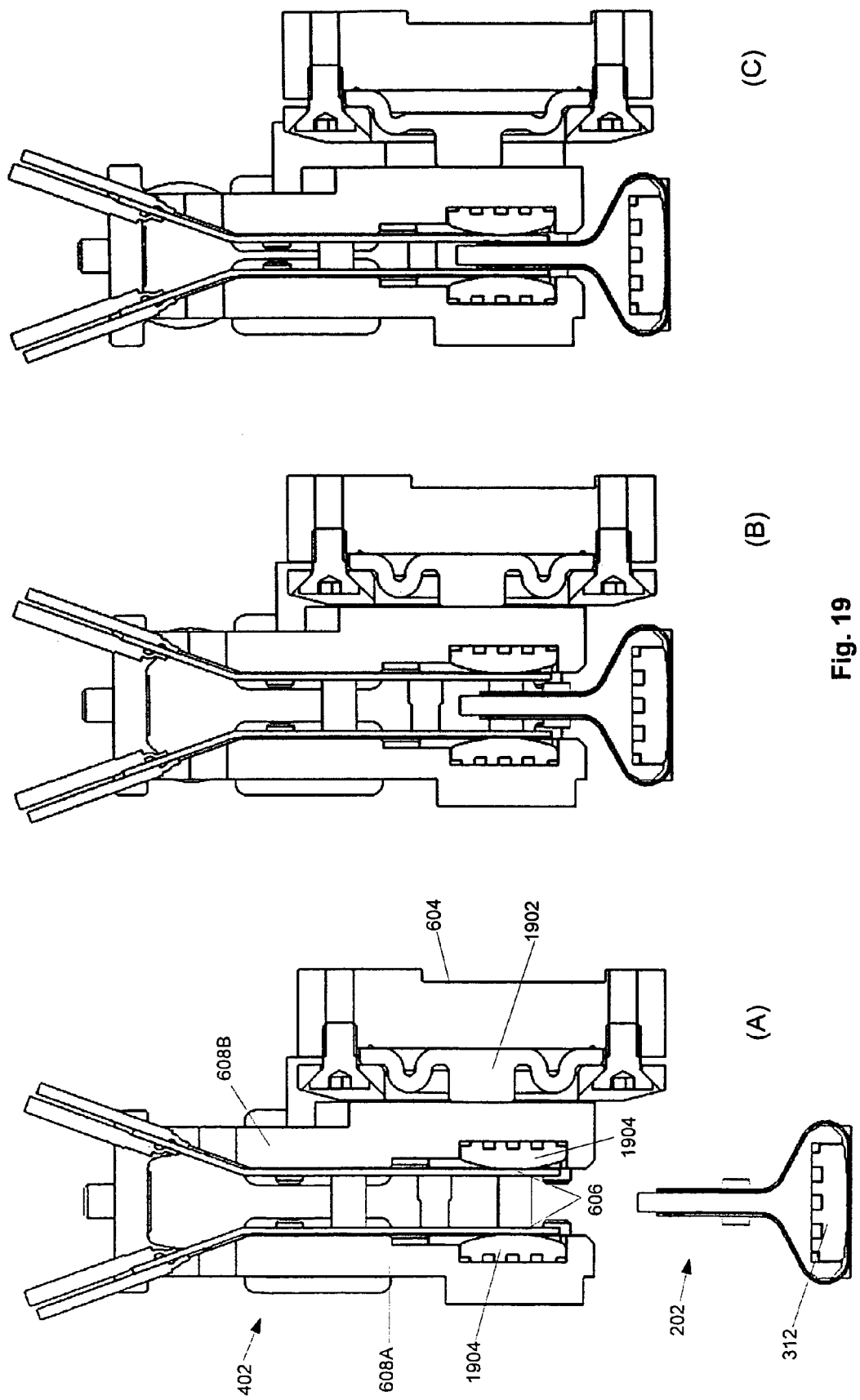
FIGS. 19A-19C show a cross-section view of a clamping assembly and a spine assembly at various stages of the docking process.

In the embodiment shown in FIG. 3, the compressible member is a piece of silicone rubber inserted into the spine behind the contacts. In another embodiment (see FIGS. 19A-19C)), the compressible member is a piece of silicone rubber that backs up each of the flexible circuits which clamp down onto the connections on the spine. In yet another alternative embodiment, the clamping mechanism itself doubles as the flexible/compressible member. That is, silicone or urethane (i.e., elastomeric) flexible bladders bear directly on the back of the flexible circuits and expand to create the required compressive force.

Referring once again to FIG. 2, DUT assembly 102 includes a central assembly 204 which includes features by which the initial alignment of assembly 102 to assembly 106 may be achieved. That is, assembly 204 includes a central lifting point 206 by which DUT assembly 102 may be moved up and down. In addition, kinematic couple alignment channels defined by cylindrical shafts 208 are provided which correspond to kinematic structures on tower assembly 106 (described below) and which facilitate securing of the relative positions of DUT assembly 102 and tower assembly 106 when the two assemblies are engaged with each other. More on the nature of this kinematic coupling will be described below.

It should be understood that the specific implementations of the DUT assembly and spines of FIGS. 1-3 are merely exemplary and that many variations of these basic structures are within the scope of the invention. For example, board 104 is not restricted to the circular geometry shown in the figures. Rather, any shape suitable for the particular application, e.g., rectangular, may be employed. In addition, the configuration of the spines need not be as shown. That is, for example, rather than the radial distribution depicted in FIGS. 1-3, the spines may be distributed in a rectilinear distribution. As a practical matter, any distribution of spines or equivalent structures as appropriate for a particular application may be employed.

Moreover, the structure of the spines themselves may vary considerably without departing from the scope of the invention. For example, instead of employing the described flex circuit to route signals out of the plane of the DUT board, signal traces could be integral to the support structure itself which might comprise, for example, a printed circuit board. Any physical structure which can translate signals out of the plane of the DUT board may be employed for this aspect of the invention.

Figure 4:
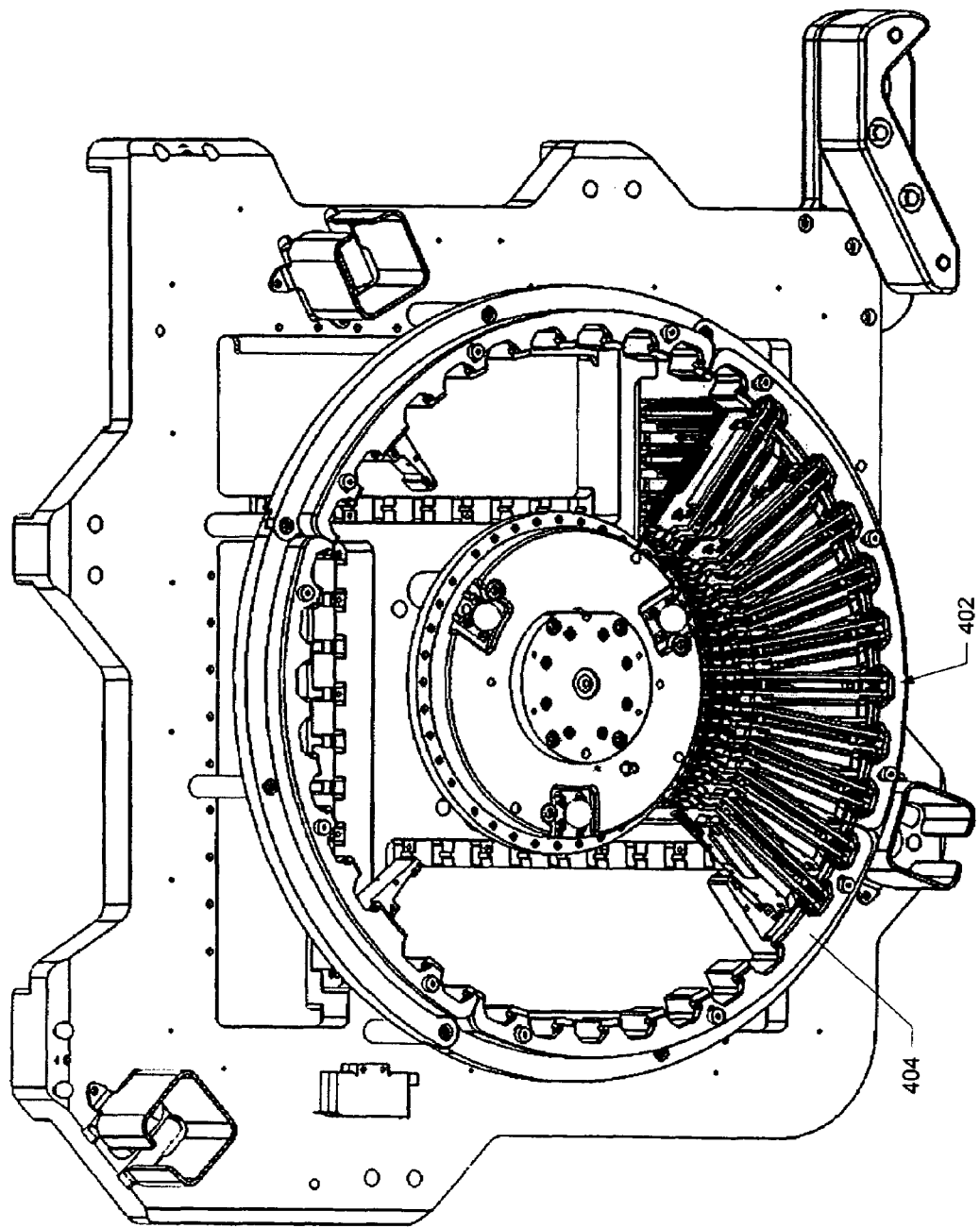
FIG. 4 is a closer view of the tower assembly of FIG. 1.

Referring now to FIG. 4, interface tower assembly 106 includes a plurality of clamping connector assemblies 402 radially disposed on tower assembly frame 404. As mentioned above with reference to DUT assembly 102, the radial pattern shown is merely exemplary. As will become clear, connector assemblies 402 may be disposed in as many different ways as spines 202 and, in fact, must correspond to the distribution of spines on the associated DUT assembly.

Each connector assembly 402 corresponds to one of spines 202 on DUT assembly 102. When tower assembly 106 and DUT assembly 102 are engaged, each of spines 202 fits into a corresponding connector assembly 402, the inner walls of which have electrical contacts which correspond to and make connections with contacts 310 on flex circuit 306.

Figure 5:
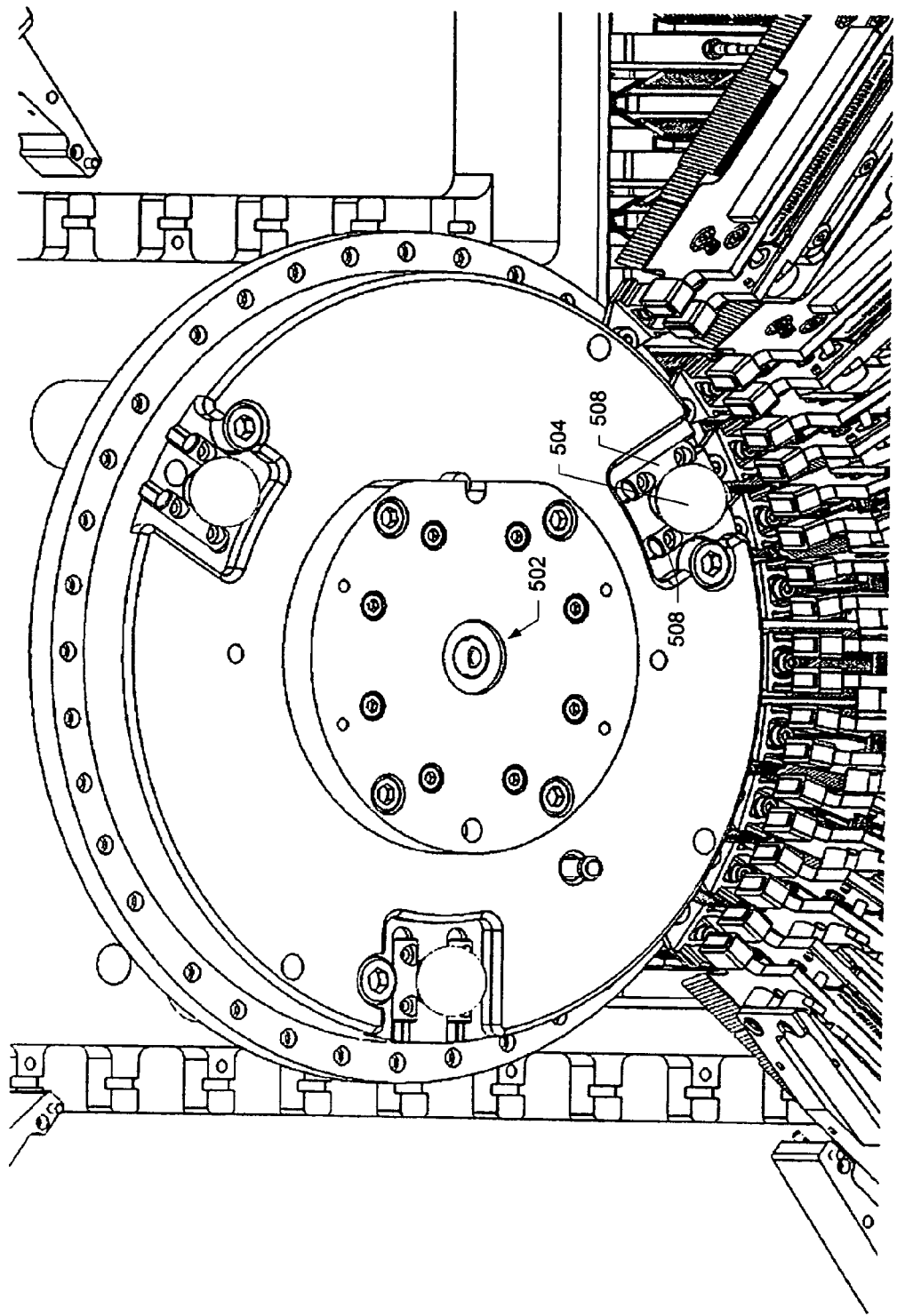
FIG. 5 is still a closer view of the tower assembly of FIG. 1 illustrating the mechanism by which the tower assembly is secured to and aligned with the DUT assembly.

According to a specific embodiment, engagement and coarse alignment between DUT assembly 102 and tower assembly 106 is facilitated using a pneumatic latch mechanism and a kinematic alignment system which are more clearly illustrated in FIG. 5. A pneumatically powered latch 502 receives lifting point 206 on DUT assembly 102 and pulls spring loaded kinematic alignment balls 504 into contact with kinematic alignment shafts 208 on the DUT assembly. When springs (see FIGS. 10, 12, and 14)) around the shaft connected to balls 504 are sufficiently compressed, balls 504 also come into contact with kinematic alignment shafts 508 on assembly 106. This kinematic arrangement resolves all six degrees of freedom, thereby inhibiting relative motion between DUT assembly 102 and tower assembly 106. It will be understood that the kinematic system illustrated in these figures is only one of many possible mechanisms which may be employed for this purpose.

Figure 6:
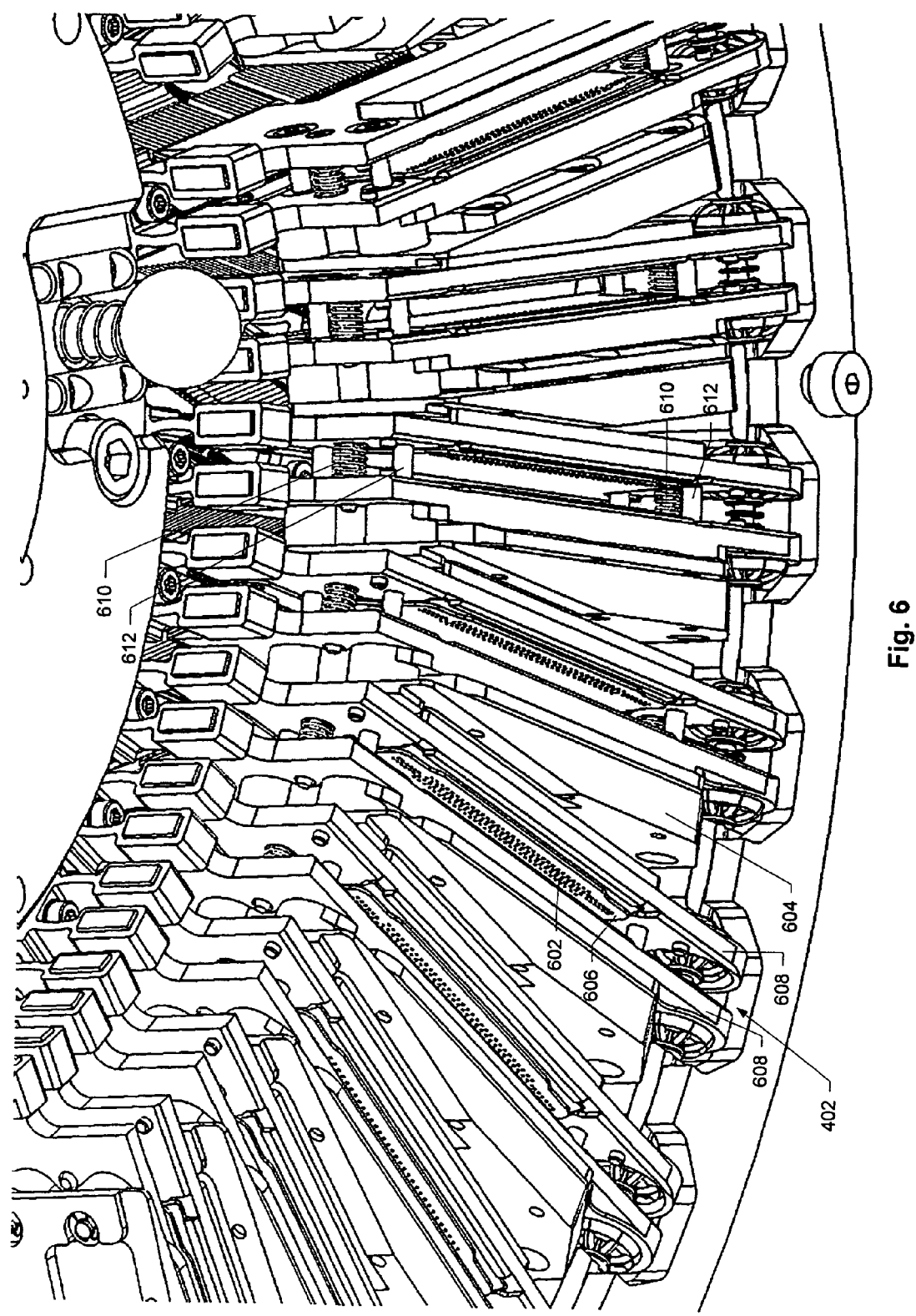
FIG. 6 is an even closer view of the tower assembly of FIG. 1 showing detailed features of the plurality of clamping assemblies of which the tower assembly is comprised.

FIG. 6 shows a closer view of a portion of an interface tower assembly 106 in which contacts 602 on the inner walls of connector assemblies 402 are apparent. The connection between contacts 602 and the corresponding contacts 310 on spine assemblies 202 are facilitated by air cylinders 604 which, once spines 202 are inserted into connector assemblies 402, force the opposing walls (i.e., connection boards 606) of each assembly 402 against the opposing sides of the corresponding spine 202. Press plates 608 are provided to ensure an even distribution of the force exerted by air cylinders 604 across connection boards 606. The clamping force is exerted via shafts 612 which extend from cylinder 604 through the near plate and are secured to the opposite side plate. Alternatively, clamping cylinders 604 may be replaced with other mechanisms such as, for example, expandable cylinders or bladders made of silicone or urethane. These approaches are to be contrasted with the conventional approach in which a pogo stack contacts and is forcibly compressed against pads on the probe or contactor card in a direction normal to the plane of the card.

According to various embodiments, contacts 308, 310, and 602 may be implemented in a variety of ways. That is, the term "contacts" has been used in the foregoing description to generically refer to a conductor termination which may form an electrical connection with another conductor termination, e.g., pads and bumps. It will be understood that the specific type of contact employed is immaterial as long as sufficient connective integrity is maintained for the particular application.

FIG. 6 also shows springs 610 which work to keep connection boards 606 apart against the action of clamping cylinders 604. Thus, in the event of the loss of air pressure, clamping connector assemblies 402 will automatically open. According to alternative embodiments, elastic spacers may be used to perform this function.

Figure 7:
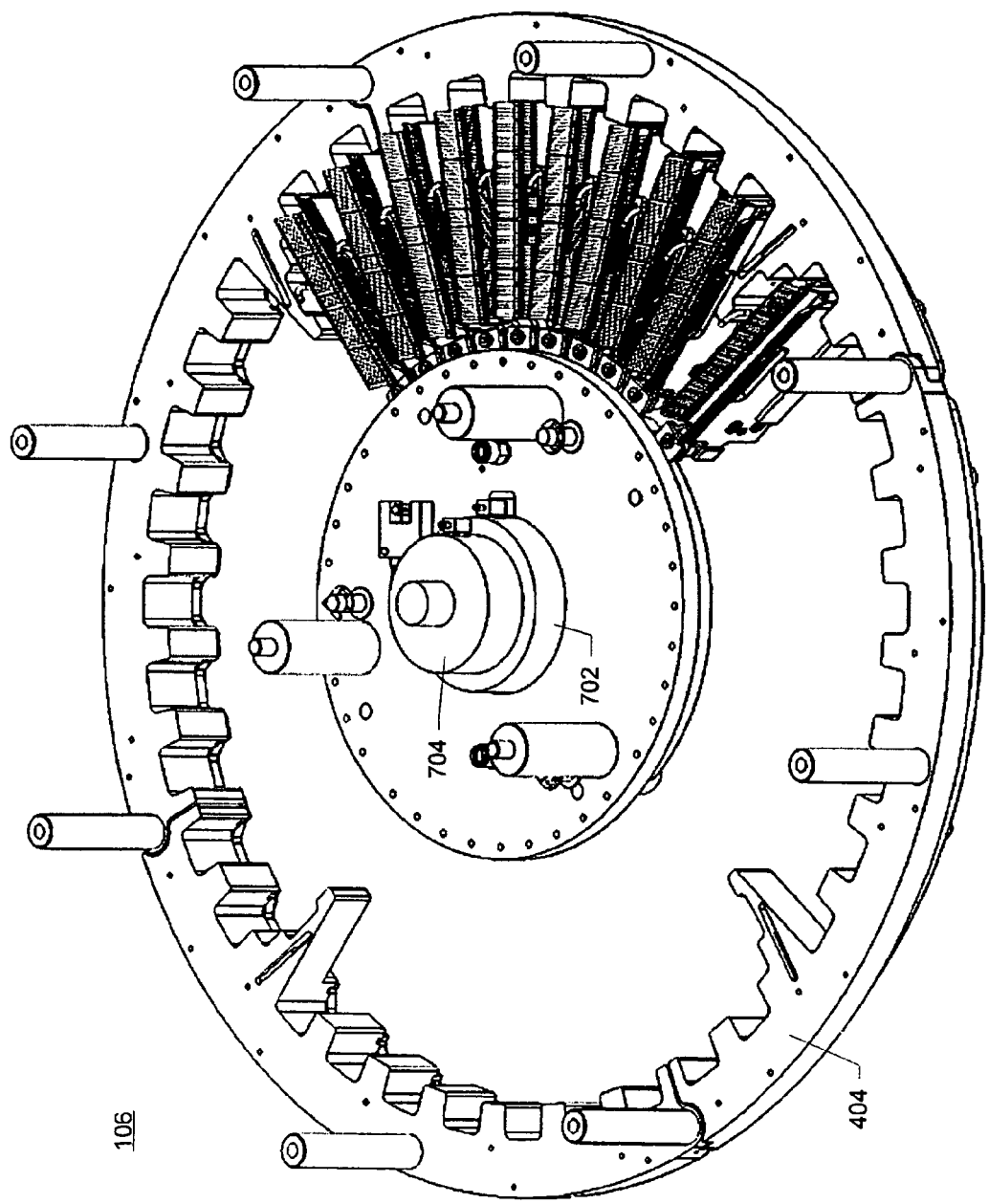
FIG. 7 is a view of the opposite side of the tower assembly.

FIG. 7 shows tower assembly 106 from the opposite side of previous views. Air cylinder 702 powers latch 502. Emergency brake 704 which requires air pressure to be released ensures that once assemblies 102 and 106 are secured together they remain together even if there is a loss of power and/or air pressure. In fact, according to a specific embodiment, when the assemblies are docked, power is removed from air cylinder 702, and brake 704 is engaged, thereby making disengagement of the assemblies virtually impossible without reapplication of power.

Figure 8:
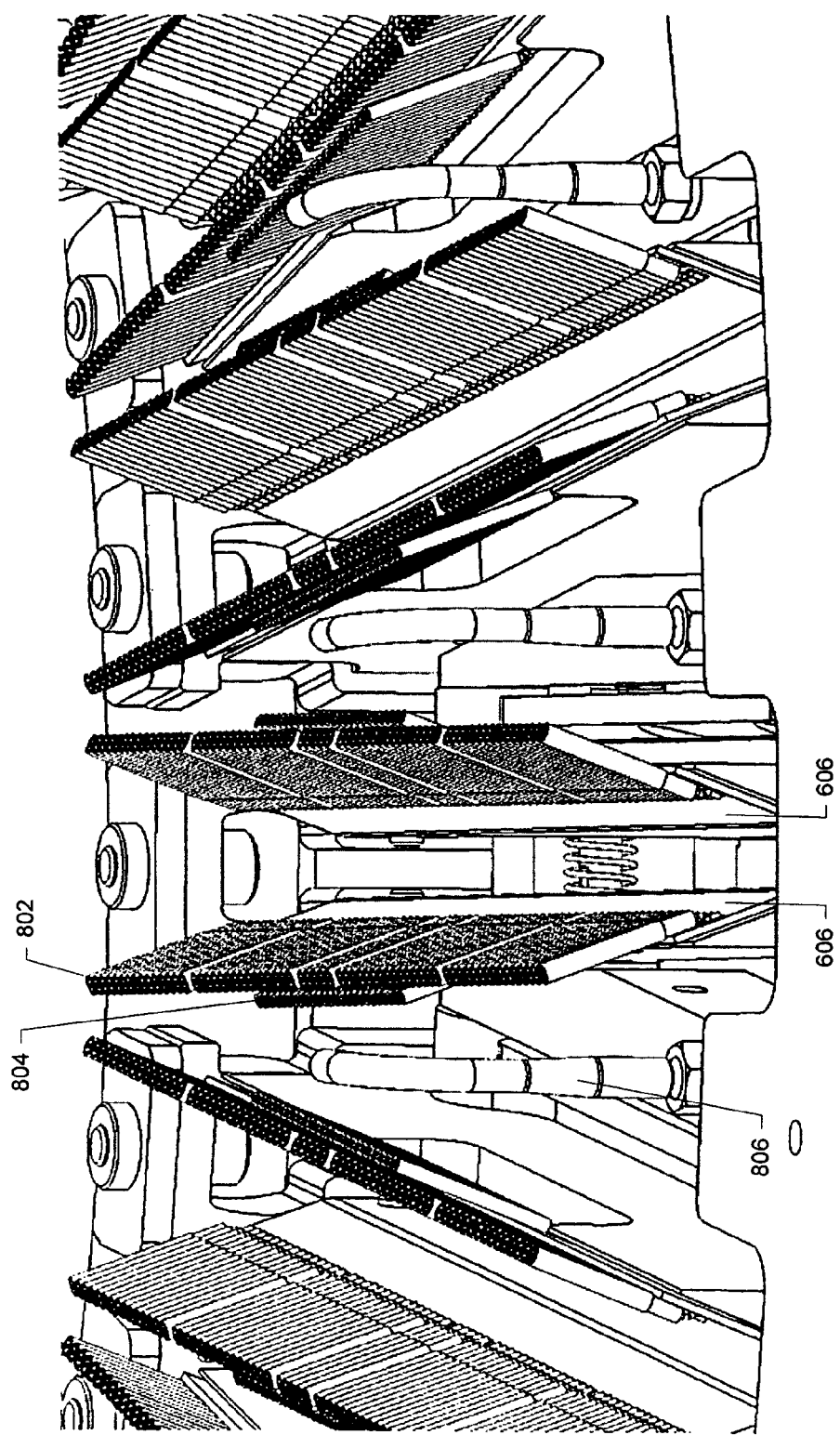
FIG. 8 is a closer view of the side of the tower assembly shown in FIG. 7 in which the interface between signal lines and the clamping assemblies is shown.

A closer view of a portion of this side of tower assembly 106 is shown in FIG. 8. In this view, the upper portions of connection boards 606 can be seen, attached to which are a plurality of shielded transmission lines 802 for routing a variety of high-speed signals to and from test boards associated with the automated test equipment (not shown). Unshielded conductors 804 are also shown which provide connection and utility signals to and from connection boards 606. Air hoses 806 provide air pressure to clamping cylinders 604.

It should be noted that the functions served by connection boards 606 and transmission lines 802 may be provided in a variety of ways without departing from the scope of the invention. According to a specific embodiment, connection boards 606 are implemented using flex circuits. According to an even more specific embodiment, both connection boards 606 and transmission lines 802 are replaced with a flex circuit which is designed as described in commonly assigned, copending U.S. patent application Ser. No. 10/365, 262 for FLEX-CIRCUIT-BASED HIGH SPEED TRANSMISSION LINE filed on Feb. 11, 2003, now U.S. Pat. No. 6,888,427, the entire disclosure of which is incorporated herein by reference.

It should be noted at this point that the system described above may be used to provide repeatable connectivity for a wide variety of applications, some of which relate to the high-speed testing of semiconductor wafers or electronic circuits. It should also be understood that the parallelism represented by the system described above may be leveraged in a variety of ways to take full advantage of the invention. For example, most or all of the connectivity provided by such a system could be used to simultaneously test an entire wafer (e.g., 8 inches or larger). Alternatively, a large number of separate and distinct DUTs might be connected to each spine on the DUT assembly, allowing for the simultaneous testing and verification of hundreds of devices.

The kinematic coupling described above ensures a precise and repeatable alignment between the DUT assembly and the tower assembly. According to various embodiments of the invention, a degree of "independent suspension" is provided for each of the clamping connector assemblies with respect to the tower assembly of which they are a part. This allows for some self-alignment of the clamping connector assemblies to the spines on the DUT assembly which, as will be discussed, both simplifies the overall design as well as ensures the reliable and repeatable alignment of the contacts on both assemblies. The manner in which this independent suspension is accomplished according to a specific embodiment of the invention will be described below with reference to FIGS. 16-19.

According to a specific embodiment and as will be described with reference to FIGS. 9-15, this independent suspension allows each clamping connector assembly to "float" in all axes. FIGS. 9-15 illustrate the alignment, docking, and clamping functionalities of the embodiment of the invention described herein.

Figure 9:
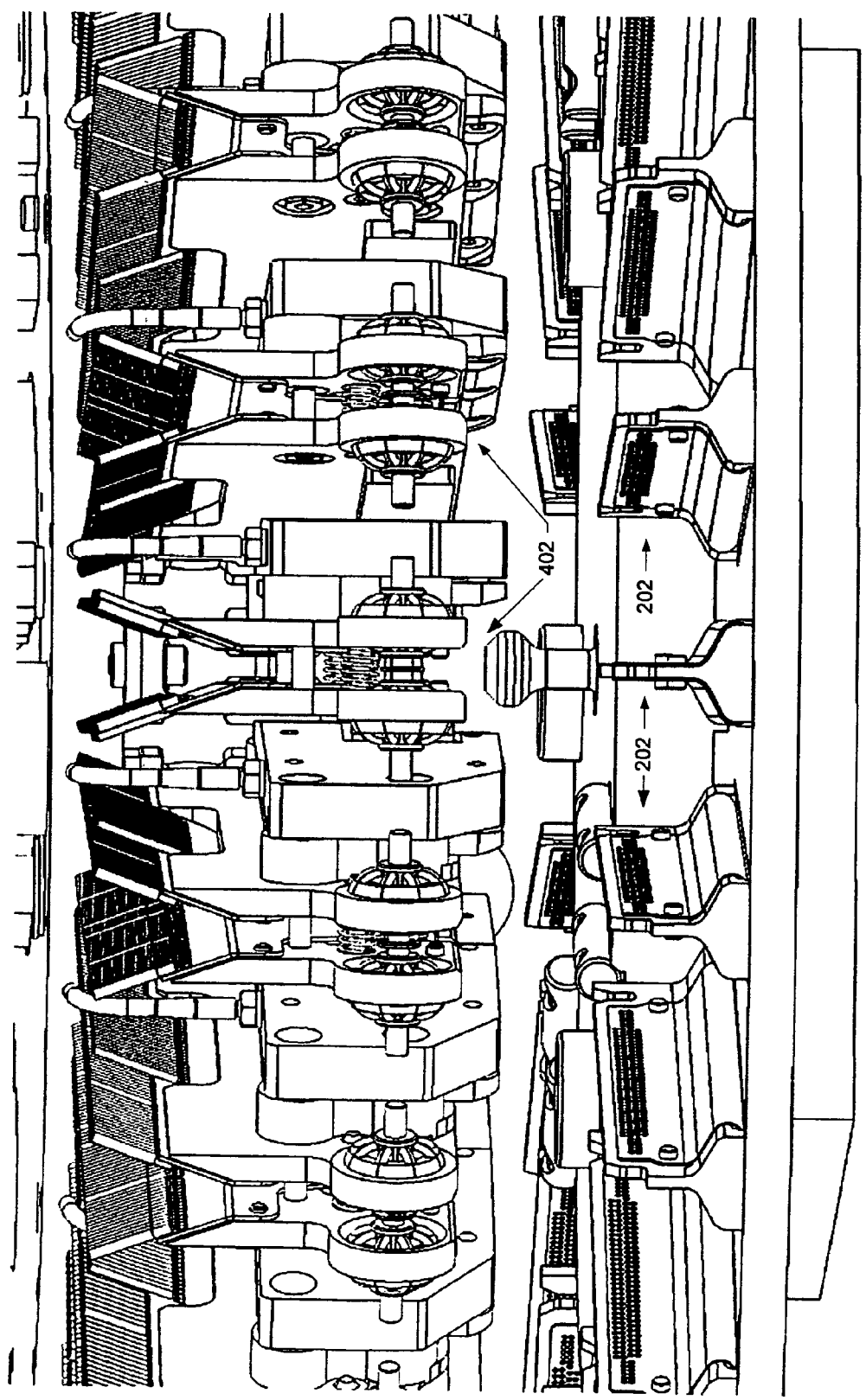
FIG. 9 is a view of the system in which the clamping assemblies and the corresponding spine assemblies are aligned.
Figure 10:
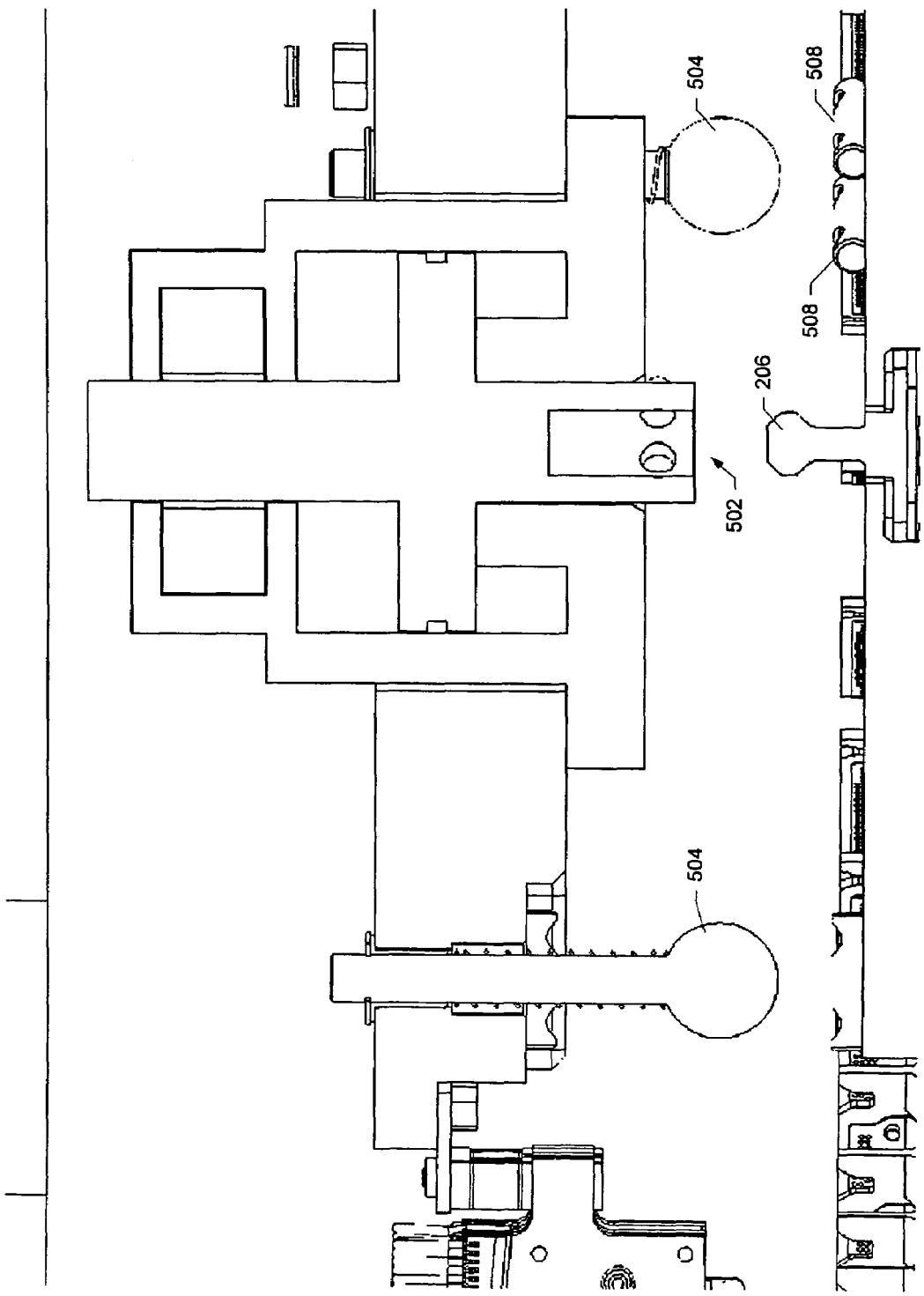
FIG. 10 is a cutaway view of the lifting and alignment mechanisms corresponding to the position of FIG. 9.

Initial alignment between the tower assembly and the DUT assembly (shown in FIG. 9) is achieved by inserting the DUT assembly's lifting point 206 into lifting point receiver 502, and bringing kinematic alignment balls 504 on the tower assembly into contact with the kinematic alignment channels on the DUT assembly as shown in FIG. 10. As shown in FIG. 9, this brings spine assemblies 202 into a coarse alignment with clamping connector assemblies 402.

Figure 11:
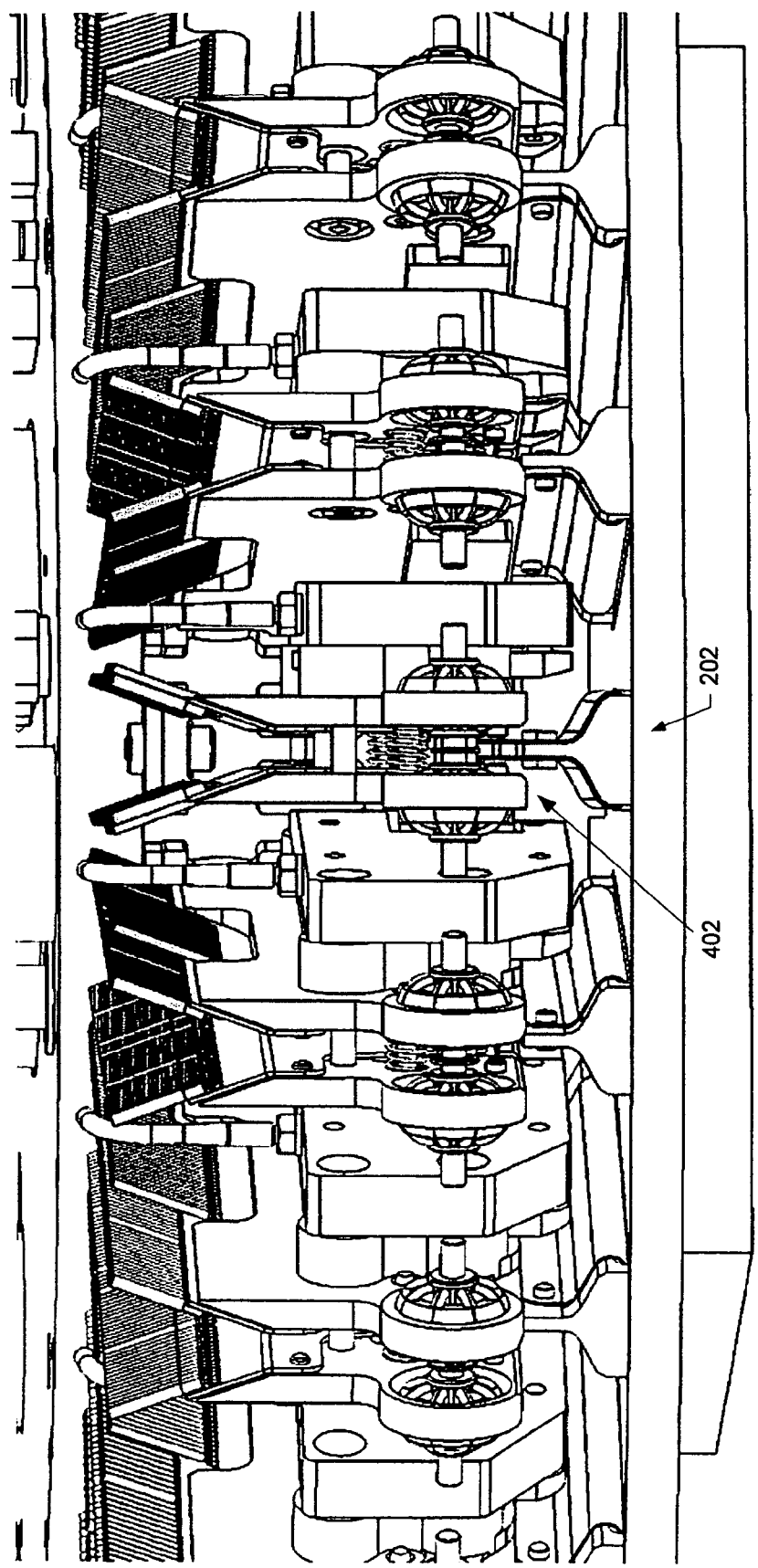
FIG. 11 is a view of the system in which the clamping assemblies and the corresponding spine assemblies are in a pre-docking position.
Figure 12:
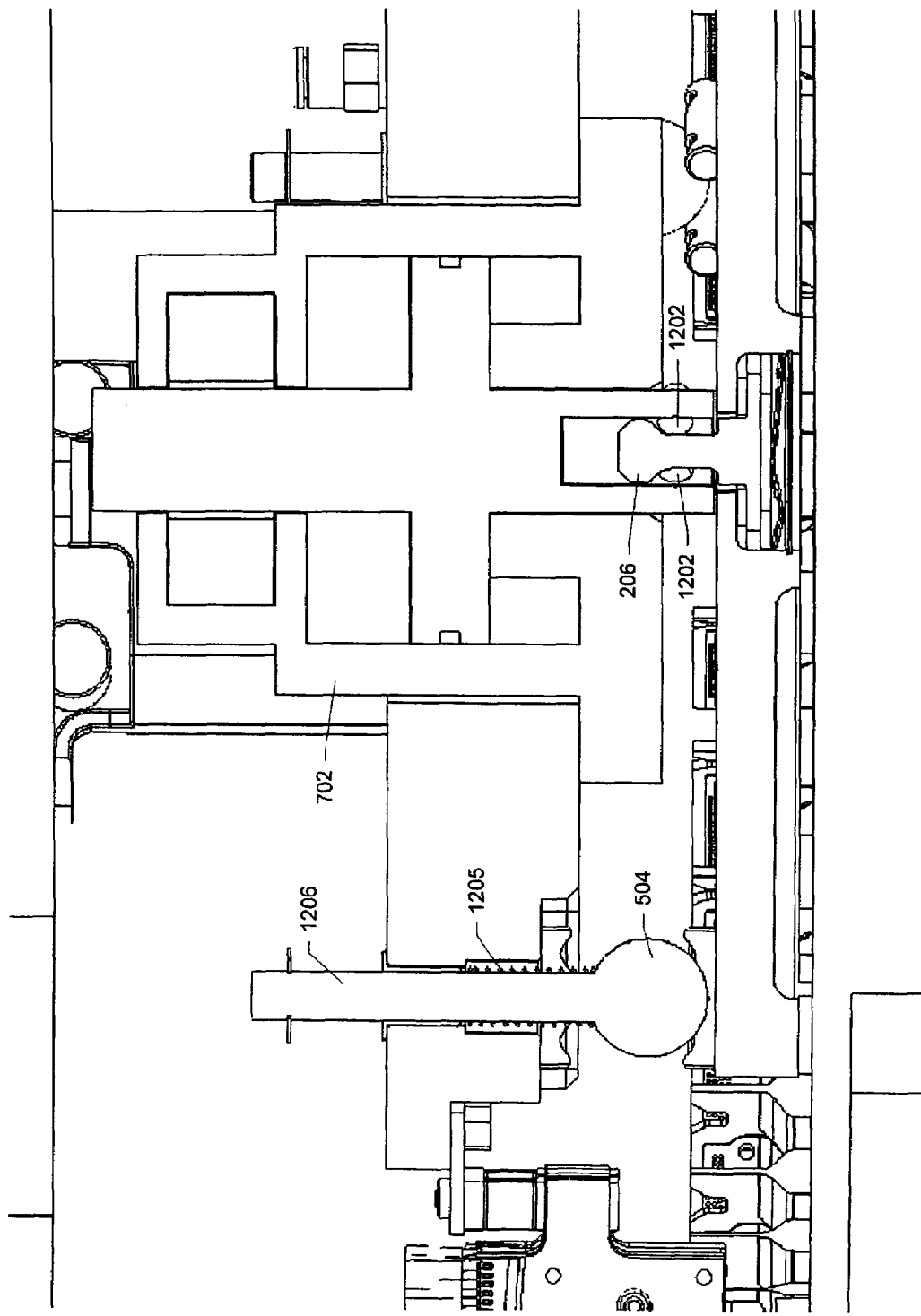
FIG. 12 is a cutaway view of the lifting and alignment mechanisms corresponding to the position of FIG. 11.

In the pre-docking position of FIG. 11, spines 202 are brought into closer proximity with their corresponding connector assemblies 402. As shown in FIG. 12, this is achieved when the DUT assembly has been lifted sufficiently such that the top of lifting point 206 is above latching balls 1202. At this point, lifting point air cylinder 702 is energized, causing latching balls 1202 to be driven inward and under the top of lifting point 206. Spring 1205 around shaft 1206 associated with each kinematic alignment ball 504 is compressed as shown, pushing the opposing end of shaft 1206 upward.

As mentioned above, the kinematic system of this embodiment allows for a precise and repeatable alignment between the two major assemblies. However, given the level of parallelism and the number of subassemblies on each assembly which must be precisely aligned, an alignment system is provided which independently aligns each clamping connector assembly with its corresponding spine assembly. That is, each clamping connector assembly 402 has two shafts (shafts 612 of FIG. 6) which mate with the corresponding alignment slots 304 and 305 on spine 202 to achieve the docked position of FIG. 13. Because of the fact that clamping connector assemblies 402 are able to move independently in all axes, when these pairs of shafts are engaged, independent and precise alignment is achieved between the contacts on each spine 202 and the corresponding contacts on the connection boards or flex circuits of the associated clamping connector assembly 402.

In any case, this freedom of movement in combination with the local alignment mechanisms for each clamping connector/spine pair and the clamping action provided by the clamping devices compensates for minor variations in spine orientation with respect to any of x, y, z, pitch, roll, or yaw, thereby decreasing dependence on the kinematic system for aligning the contacts on every spine with the corresponding contacts on every clamping connector.

Figure 13:
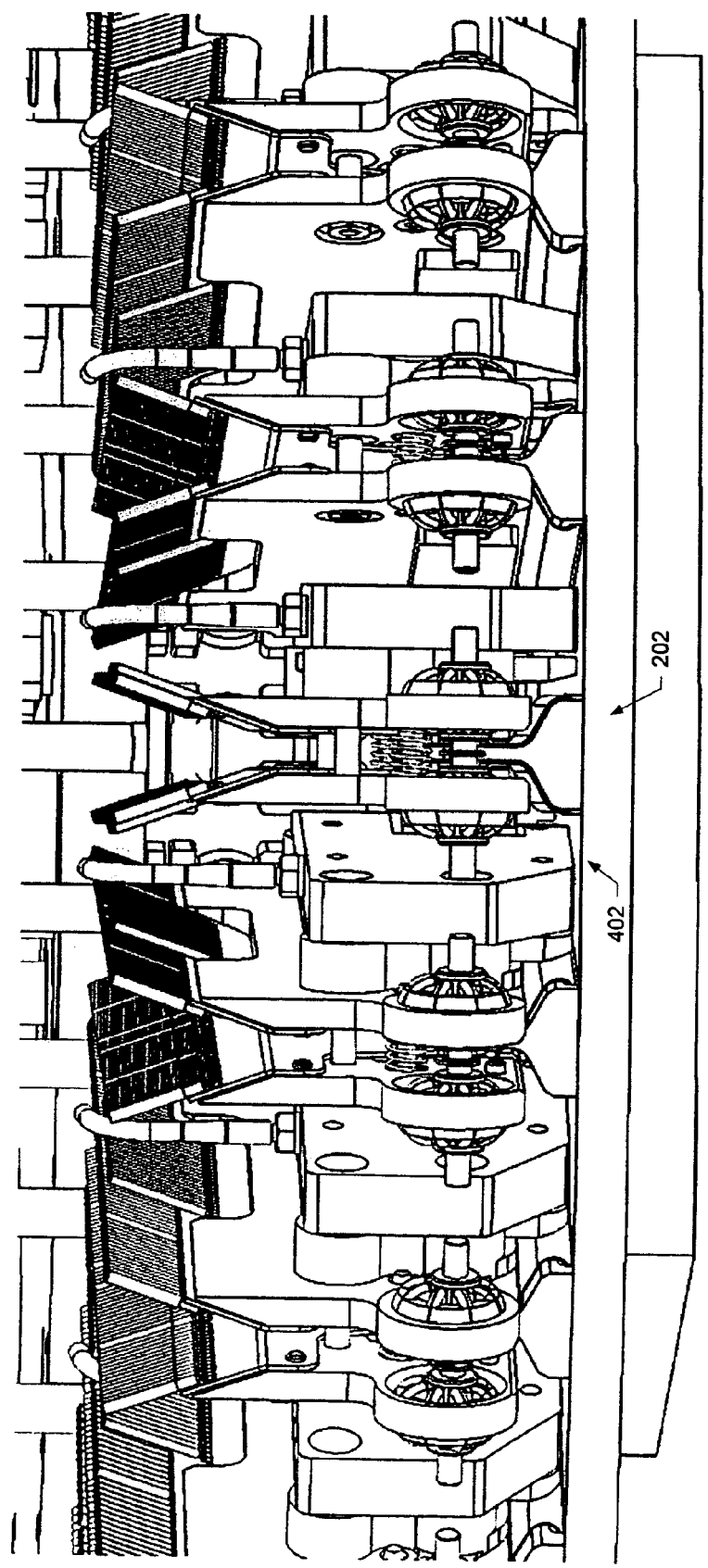
FIG. 13 is a view of the system in which the clamping assemblies and the corresponding spine assemblies are docked.
Figure 14:
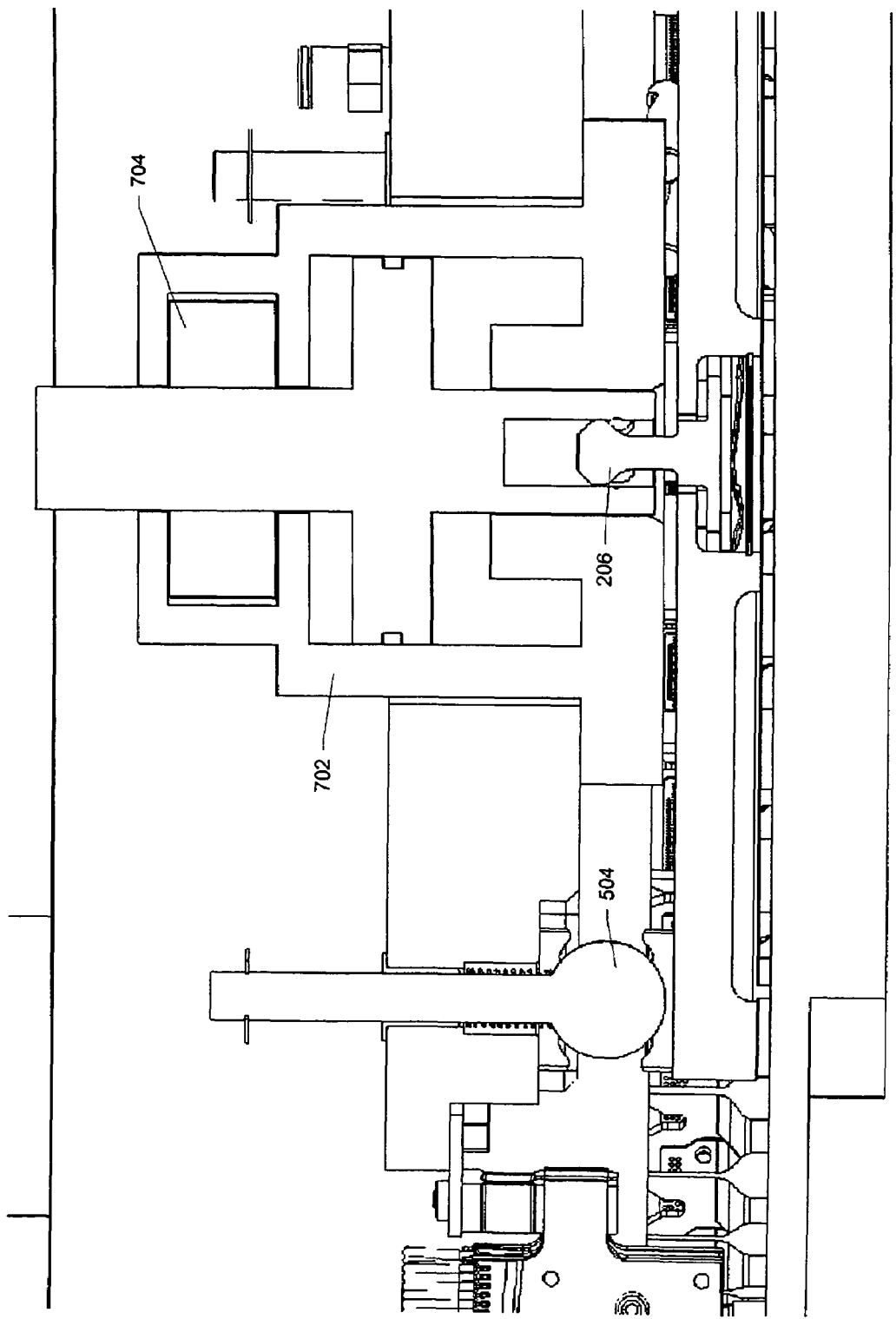
FIG. 14 is a cutaway view of the lifting and alignment mechanisms corresponding to the position of FIG. 13.

The docked position of FIG. 13 is achieved by the action of lifting point air cylinder 702 on lifting point 206 and the resulting action of the kinematic system. As shown in FIG. 14, air cylinder 702 lifts the DUT assembly until each kinematic alignment ball 504 stops further lifting by coming to rest against the bottom and top kinematic alignment channels (i.e., the channels defined by shafts 208 of FIG. 2 and shafts 508 of FIG. 5). Because air cylinder 702 has not bottomed, lifting point 206 (and therefore the DUT assembly) is being held in place at this point by the lifting action of the air cylinder which, because of the continuous pressure which maintains the kinematic alignment balls in the kinematic alignment grooves, maintains alignment between the DUT assembly and the tower assembly.

Once the assemblies are in the docked position of FIG. 13, the air signal to emergency brake 704 is removed and the brake is engaged. Thus, even if air pressure to the system is lost the DUT assembly would remain in position, a desirable result from both a safety perspective and a cost perspective.

Figure 15:
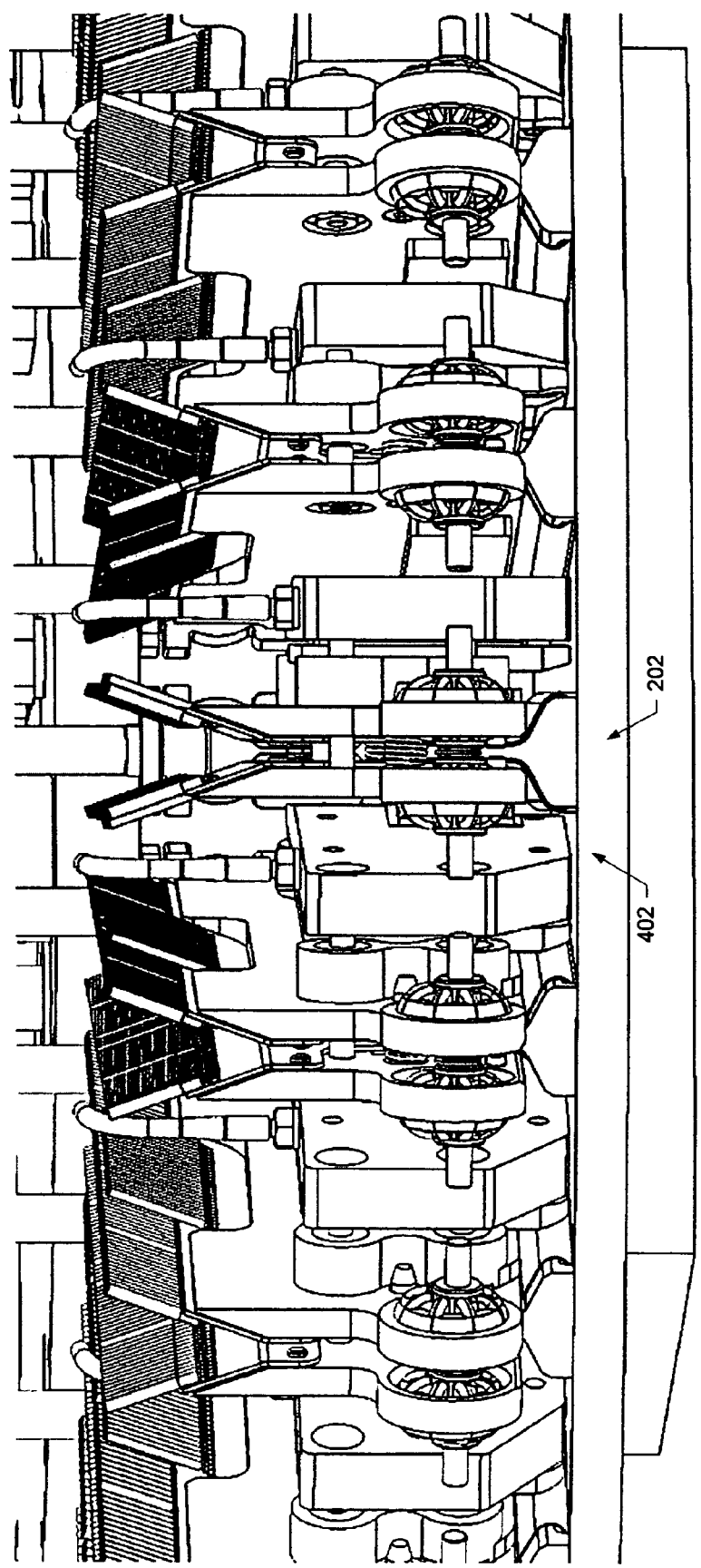
FIG. 15 is a view of the system in which the clamping assemblies are clamped onto the corresponding spine assemblies.

Once the DUT assembly and the tower assembly are in the docked position of FIGS. 13 and 14, air signals to clamping cylinders 604 are asserted which exert force via shafts 612 thereby causing each clamping connector assembly to clamp onto the inserted spine assembly, establishing the electrical connections between the contacts (e.g., pads or bumps) on the spine's flex circuit and the corresponding contacts on the connection boards (e.g., bumps or pads). An illustration of this clamped position is shown in FIG. 15.

A more detailed description of a particular mechanism for achieving the independent suspension of the individual clamping assemblies will now be provided with reference to FIGS. 16-19. FIGS. 16A-16C show isolated views of a clamping assembly 402 and a spine assembly 202 in relative positions corresponding to FIGS. 11, 13, and 15, respectively. Each plate 608 of clamping assembly 402 includes an elastomer grommet 1602 having flexible spokes centered on a plastic bushing 1604 through which a shaft 1606 extends. Grommets 1602 and bushings 1604 are able to slide along shaft 1606 which is secured in a corresponding groove at the outer edge of assembly 404.

Assembly 402 is secured to the inner edge of assembly 404 via urethane structure 1608. The flexible natures of grommets 1602 and structure 1608 provide the independent suspension which, together with the local mechanical alignment features described above, enables the precise alignment of each individual pair of assemblies 202 and 402.

Figure 17:
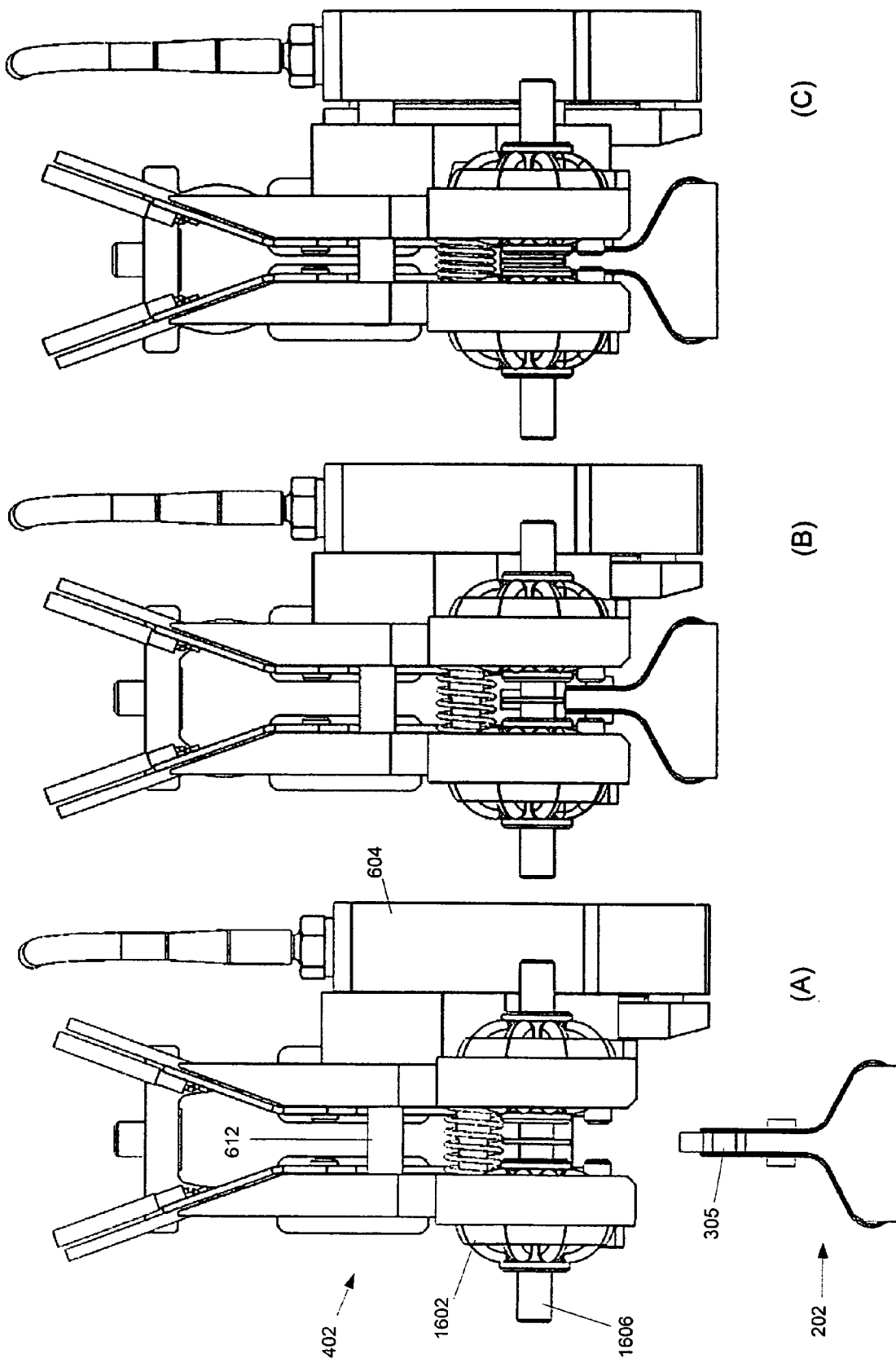
FIGS. 17A-17C show a first end-on view of a clamping assembly and a spine assembly at various stages of the docking process.
Figure 18:
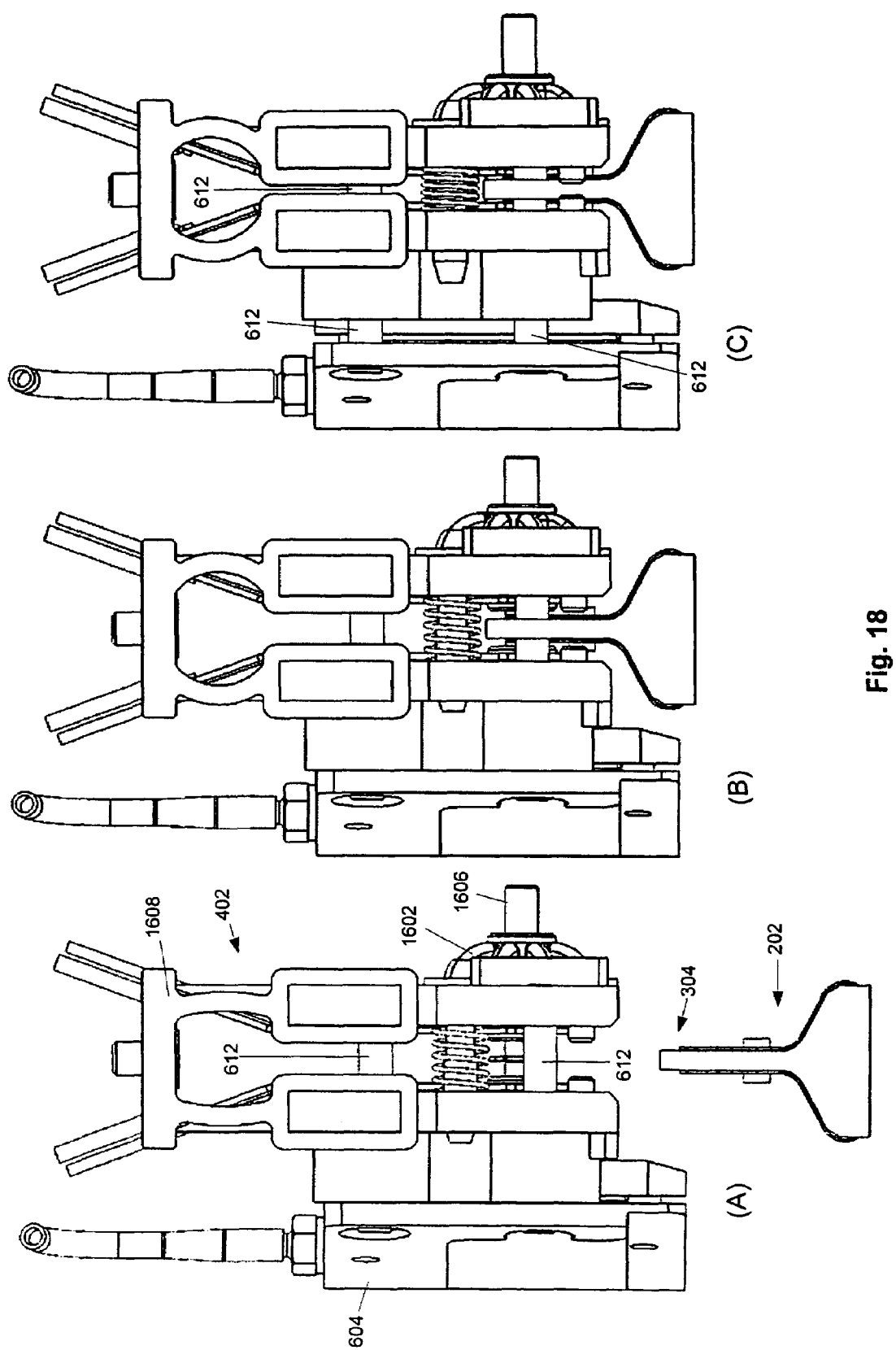
FIGS. 18A-18C show a second end-on view of a clamping assembly and a spine assembly at various stages of the docking process.

FIGS. 17A-17C and FIGS. 18A-18C show end-on views of the same isolated pair of assemblies in the various stages of docking. The views of FIG. 17 are from the outer edge of assembly 404 looking toward its center, and those of FIG. 18 are from the center looking out. Local alignment features 304 and 305 of assembly 202 engage the lower shafts 612 coupled to cylinder 604 (the one in FIG. 17A being obscured by shaft 1606), and effect the alignment of the electrical connections on the respective assemblies. As can be seen in FIGS. 17B and 18B, the independent suspension of assembly 402 (most clearly illustrated in FIG. 17B by the deformation of flexible structure 1608) results in the assembly being raised up slightly with respect to its previous position in FIGS. 17A and 18A. As can be seen in FIG. 18C, structure 1608 is further deformed as clamping cylinder 604 causes assembly 402 to clamp onto assembly 202.

FIGS. 19A-19C provide cross-sectional views of the views of FIGS. 17A-17C. In this embodiment, clamping cylinder 604 employs an inflatable bladder 1902 which, when inflated, pulls left plate 608A and pushes right plate 608B together via the action of shafts 612 extending through the right plate and attaching to the left. Also shown in these figures is the use of flexible material 1904 in plates 608 behind connection boards 606 to provide backing for the contacts on connection boards 606. As discussed above with reference to FIG. 3, this ensures that the electrical connections made with the contacts on assembly 202 will have sufficient integrity despite any possible minor variations in contact height.

Figure 20:
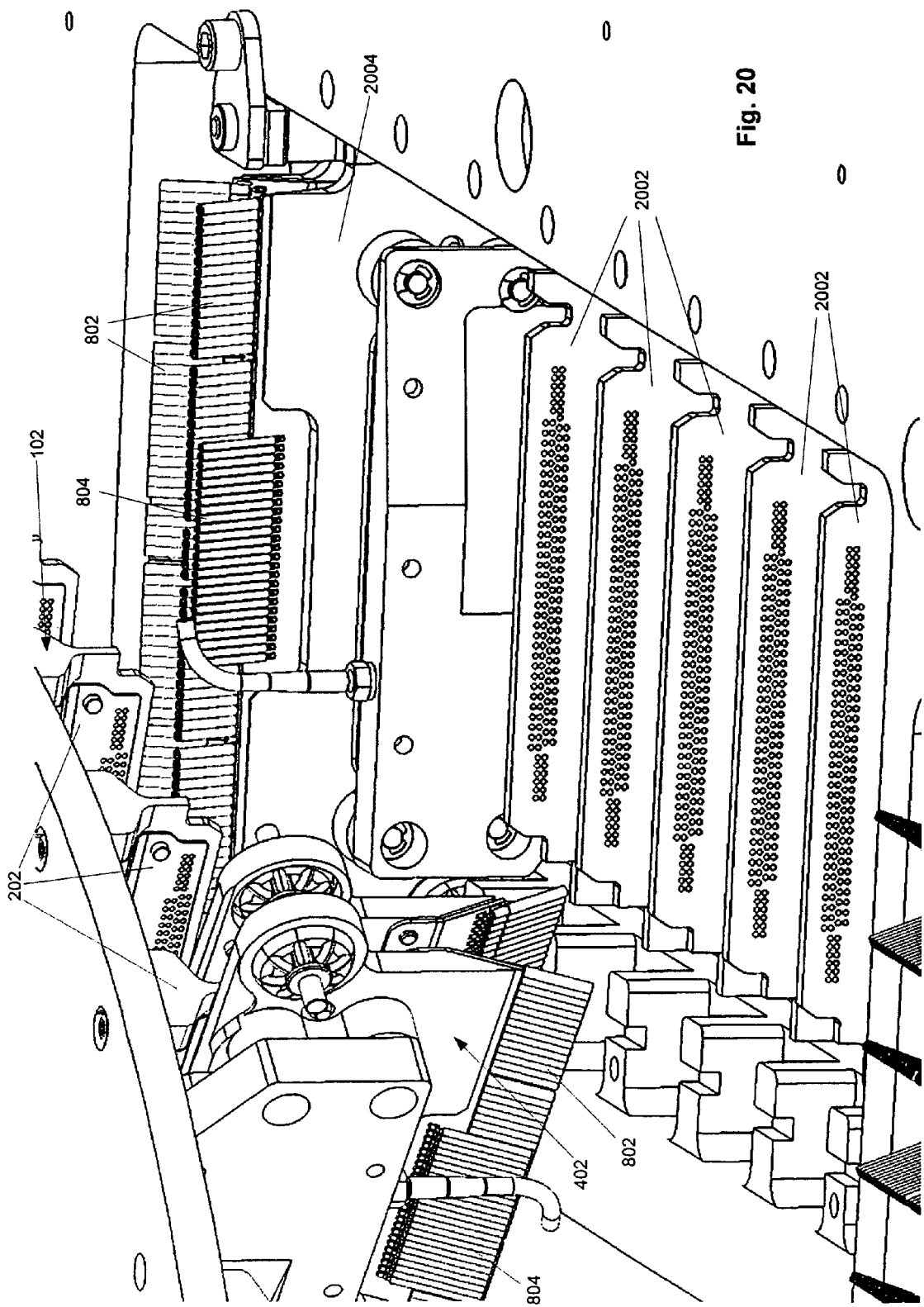
FIG. 20 shows how the tower assembly of FIG. 1 may be connected to the test electronics according to a specific embodiment of the invention.

According to a specific embodiment, another set of clamping assemblies is employed to connect clamping assemblies 402 with the test electronics in the test equipment. An example of how this may be accomplished is shown in FIG. 20. Many of the clamping assemblies and various other system components have been removed from the drawing for clarity. To relate the illustrated context to previous figures, clamping assembly 402 is shown clamped to one of spine assemblies 202 on DUT assembly 102.

Clamping assembly 402 is also connected back-to-back (via conductors 802 and 804) with another clamping assembly (not shown) which clamps onto one of test connection boards 2002. This is accomplished in a manner similar to that described above with respect to the docking process between assemblies 202 and 402. One such clamping assembly 2004 is shown having conductors 802 and 804 to which a clamping assembly 402 (not shown) is connected back-to-back. Test connection boards 2002 are either part of, or are connected to, one or more PE boards which carry signals to and from the test equipment. In this way, connections to the system test electronics are provided to the devices under test connected to DUT assembly 102.

While the invention has been particularly shown and described with reference to specific embodiments thereof, it will be understood by those skilled in the art that changes in the form and details of the disclosed embodiments may be made without departing from the spirit or scope of the invention. For example, some of the descriptions of embodiments herein imply a certain orientation of various assemblies of which the system is constructed. It will be understood, however, that the principals of the present invention may be employed in systems have a variety of spatial orientations and that therefore the invention should not be limited to the specific orientations shown.

According to a particular alternative, instead of a plurality of spine assemblies on a horizontally disposed board, the DUT assembly may comprise a plurality of vertically disposed DUT boards (e.g., printed circuit boards). According to this approach, the end of each board takes the place of one of the spines in the above-described embodiments. Each clamping assembly in the tower clamps on the end of a corresponding one of the vertical boards.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A system for connecting a first plurality of signal lines to a second plurality of signal lines, comprising:
   a first assembly comprising a plurality of first contact arrays, each of the contacts in each of the first contact arrays being in electrical contact with a corresponding one of the first plurality of signal lines, each of the first contact arrays having a first mechanical alignment feature associated therewith; and
   a second assembly comprising a plurality of contact assemblies, each of the contact assemblies being suspended within the second assembly such that each contact assembly is operable to move independently in at least four degrees of freedom relative to the second assembly, each contact assembly having a second contact array associated therewith, each of the contacts in each of the second contact arrays being in electrical contact with a corresponding one of the second plurality of signal lines, each of the contact assemblies having a second mechanical alignment feature associated therewith;
   wherein the second contact array of each contact assembly is operable to align with a corresponding one of the first contact arrays through interaction of the first and second mechanical alignment features and movement of the corresponding contact assembly in at least some of the degrees of freedom.

2. The system of claim 1 further comprising flexible suspension components associated with each contact assembly by which each contact assembly is suspended in the second assembly.

3. The system of claim 1 wherein the first contact arrays are configured on rigid circuit assemblies each having a plurality of conductors embedded therein electrically connecting the contacts of the first contact arrays to the first signal lines.

4. The system of claim 1 wherein the second contact arrays are configured on rigid circuit assemblies each having a plurality of conductors embedded therein electrically connecting the contacts of the second contact arrays to the second signal lines.

5. The system of claim 1 wherein the first contact arrays are configured on flexible circuit assemblies each having a plurality of conductors embedded therein electrically connecting the contacts of the first contact arrays to the first signal lines.

6. The system of claim 1 wherein the second contact arrays are configured on flexible circuit assemblies each having a plurality of conductors embedded therein electrically connecting the contacts of the second contact arrays to the second signal lines.

7. The system of claim 1 wherein each contact assembly is operable to move independently in six degrees of freedom relative to the second assembly, and wherein interaction between the first and second mechanical alignment features constrains movement of each contact assembly relative to the six degrees of freedom.

8. The system of claim 1 wherein the second mechanical alignment feature associated with each contact assembly comprises at least one shaft, and wherein the first mechanical alignment associated with each first contact array comprises at least one receptacle to receive the at least one shaft.

9. An electronic testing system comprising the system of claim 1 wherein the second signal lines are associated with automated test equipment and the first signal lines are associated with at least one device under test.

10. An interface assembly for connecting a first plurality of signal lines to a second plurality of signal lines, the first plurality of signal lines being associated with a probe card assembly which includes a plurality of first contact arrays, each of the contacts in each of the first contact arrays being in electrical contact with a corresponding one of the first plurality of signal lines, each of the first contact arrays having a first mechanical alignment feature associated therewith, the interface assembly comprising: a plurality of contact assemblies, each of the contact assemblies being suspended within the interface assembly such that each contact assembly is operable to move independently in at least four degrees of freedom relative to the interface assembly, each contact assembly having a second contact array associated therewith, each of the contacts in each of the second contact arrays being in electrical contact with a corresponding one of the second plurality of signal lines, each of the contact assemblies having a second mechanical alignment feature associated therewith, wherein the interface assembly is configured such that the second contact array of each contact assembly is operable to align with a corresponding one of the first contact arrays through interaction of the first and second mechanical alignment features and movement of the corresponding contact assembly in at least some of the degrees of freedom.

11. The interface assembly of claim 10 further comprising flexible suspension components associated with each contact assembly by which each contact assembly is suspended in the interface assembly.

12. The interface assembly of claim 10 wherein the second contact arrays are configured on rigid circuit assemblies each having a plurality of conductors embedded therein electrically connecting the contacts of the second contact arrays to the second signal lines.

13. The interface assembly of claim 10 wherein the second contact arrays are configured on flexible circuit assemblies each having a plurality of conductors embedded therein electrically connecting the contacts of the second contact arrays to the second signal lines.

14. The interface assembly of claim 10 wherein each contact assembly is operable to move independently in six degrees of freedom relative to the interface assembly, and wherein interaction between the first and second mechanical alignment features constrains movement of each contact assembly relative to the six degrees of freedom.

15. The interface assembly of claim 10 wherein the second mechanical alignment feature associated with each contact assembly comprises at least one shaft, and wherein the first mechanical alignment associated with each first contact away comprises at least one receptacle to receive the at least one shaft.

* * * * *

UNITED STATES PATENT AND TRADEMARK OFFICE
CERTIFICATE OF CORRECTION

| | |
|---|---|
| PATENT NO. | : 7,358,754 B2 |
| APPLICATION NO. | : 11/479354 |
| DATED | : April 15, 2008 |
| INVENTOR(S) | : Sinsheimer et al. |

Page 1 of 1

It is certified that error appears in the above-identified patent and that said Letters Patent is hereby corrected as shown below:

In line 5 of claim 15 (column 12, line 5) change "away" to --array--.

Signed and Sealed this

Sixteenth Day of September, 2008

JON W. DUDAS
*Director of the United States Patent and Trademark Office*